United States Patent
Jung et al.

(10) Patent No.: US 9,837,626 B2
(45) Date of Patent: Dec. 5, 2017

(54) ORGANIC LIGHT EMITTING DEVICE

(71) Applicant: SAMSUNG DISPLAY CO., LTD., Yongin-si, Gyeonggi-do (KR)

(72) Inventors: Myungjong Jung, Yongin-si (KR); Jin Woo Park, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 52 days.

(21) Appl. No.: 14/957,788

(22) Filed: Dec. 3, 2015

(65) Prior Publication Data

US 2016/0164021 A1    Jun. 9, 2016

(30) Foreign Application Priority Data

Dec. 4, 2014  (KR) .................. 10-2014-0173013

(51) Int. Cl.
  *H01L 51/50*   (2006.01)
(52) U.S. Cl.
  CPC ............................ *H01L 51/5044* (2013.01)
(58) Field of Classification Search
  CPC ................................................. H01L 51/5044
  See application file for complete search history.

(56) References Cited

U.S. PATENT DOCUMENTS 8,008,851 B2   8/2011   Sung et al.

FOREIGN PATENT DOCUMENTS

| JP | 2007-287652 A | 11/2007 |
|---|---|---|
| KR | 2006-0127257 A | 12/2006 |
| KR | 10-2007-0101984 A | 10/2007 |
| KR | 10-0833975 B1 | 5/2008 |
| KR | 2010-0036645 A | 4/2010 |

*Primary Examiner* — Douglas Menz
(74) *Attorney, Agent, or Firm* — Lee & Morse P.C.

(57) ABSTRACT

An organic light emitting device includes a first light-emitting layer between an anode and a cathode, the first light-emitting layer including a first light-emitting part and a second light-emitting part, a second light-emitting layer spaced apart from the first light-emitting layer and including a third light-emitting part and a fourth light-emitting part, the third light-emitting part overlapping the first light-emitting part and not overlapping the second light-emitting part, and the fourth light-emitting part not overlapping either of the first light-emitting part and the second light-emitting part, an intermediate layer between the first light-emitting layer and the second light-emitting layer, a hole transport region to inject/transport a hole into the first light-emitting part, the second light-emitting part, and the fourth light-emitting part, and an electron transport region to inject/transport an electron into the second light-emitting part, the third light-emitting part, and the fourth light-emitting part.

14 Claims, 8 Drawing Sheets

ORGANIC LIGHT EMITTING DEVICE

CROSS-REFERENCE TO RELATED APPLICATION

Korean Patent Application No. 10-2014-0173013, filed on Dec. 4, 2014, in the Korean Intellectual Property Office, and entitled: "Organic Light Emitting Device," is incorporated by reference herein in its entirety.

BACKGROUND

1. Field

The present disclosure herein relates to an organic light emitting device. More particularly, the present disclosure herein relates to an organic light emitting device having two light-emitting layers electrically isolated by an intermediate layer, and including a hole transport region injecting/transporting a hole into each of the light-emitting layers and an electron transport region injecting/transporting an electron into each of the light-emitting layers.

2. Description of the Related Art

Various displays used for multi-media apparatuses, e.g., televisions, mobile phones, tablet computers, navigation devices, and game machines, have been developed. One of these types of displays is an organic light emitting diode (OLED) display. An OLED display is a self-light emission type display and has advantages, e.g., a wide viewing angle, an excellent contrast, and a fast response rate. The OLED display includes an organic light emitting device, and a plurality of light-emitting layers may be disposed to overlap with each other in order to increase light emission efficiency of the organic light emitting device.

SUMMARY

The present disclosure provides an organic light emitting device in which two light-emitting layers are disposed to overlap with each other with an intermediate layer in-between, including a hole transport region and an electron transport region, thereby providing good efficiency and long lifespan.

Embodiments provide an organic light emitting device, including an anode on a reference plane, the reference plane being defined by a first direction and a second direction perpendicular to each other, a cathode spaced apart from the anode in a third direction normal to the reference plane, a first light-emitting layer between the anode and the cathode, the first light-emitting layer including a first light-emitting part and a second light-emitting part, a second light-emitting layer spaced apart from the first light-emitting layer in the third direction, the second light-emitting layer including a third light-emitting part and a fourth light-emitting part, the third light-emitting part overlapping the first light-emitting part and not overlapping the second light-emitting part, and the fourth light-emitting part not overlapping either of the first light-emitting part and the second light-emitting part, an intermediate layer between the first light-emitting layer and the second light-emitting layer in the third direction, the intermediate layer overlapping the first light-emitting part, a hole transport region to inject/transport a hole from the anode into the first light-emitting part, the second light-emitting part, and the fourth light-emitting part, and an electron transport region to inject/transport an electron from the cathode into the second light-emitting part, the third light-emitting part, and the fourth light-emitting part.

In other embodiments, organic light emitting devices include an anode, a cathode, a first light-emitting layer, a second light-emitting layer, an intermediate layer, a first hole transport region, a second hole transport region, a first electron transport region, and a second electron transport region.

The anode is disposed on a reference plane defined by a first direction and a second direction that are perpendicular to each other.

The cathode is spaced apart from the anode in a third direction that is a normal direction of the reference plane.

The first light-emitting layer is disposed between the anode and the cathode and includes a first light-emitting part and a second light-emitting part.

The second light-emitting layer is spaced apart from the first light-emitting layer in the third direction and includes a third light-emitting part overlapping the first light-emitting part and not overlapping the second light-emitting part; and a fourth light-emitting part not overlapping both the first light-emitting part and the second light-emitting part.

The intermediate layer is disposed between the first light-emitting layer and the second light-emitting layer in the third direction and is disposed on a portion overlapping the first light-emitting part.

The first hole transport region is disposed on a portion overlapping the first light-emitting part and the second light-emitting part in the third direction to inject/transport a hole from the anode into the first light-emitting part and the second light-emitting part.

The second hole transport region is disposed on a portion overlapping the fourth light-emitting part in the third direction to injecting/transport a hole from the anode into the fourth light-emitting part.

The first electron transport region is disposed on a portion overlapping the third light-emitting part and the fourth light-emitting part in the third direction to inject/transport an electron from the cathode into the third light-emitting part and the fourth light-emitting part.

The second electron transport region is disposed on a portion overlapping the second light-emitting part in the third direction to inject/transport an electron from the cathode into the second light-emitting part.

In still embodiments, organic light emitting devices include an anode, a cathode, a first light-emitting layer, a second light-emitting layer, an intermediate layer, a first hole transport region, a second hole transport region, a first electron transport region, and a second electron transport region.

The anode is disposed on a reference plane defined by a first direction and a second direction that are perpendicular to each other.

The cathode is spaced apart from the anode in a third direction that is a normal direction of the reference plane.

The first light-emitting layer is disposed between the anode and the cathode and includes a first light-emitting part and a second light-emitting part.

The second light-emitting layer is spaced apart from the first light-emitting layer in the third direction and includes a third light-emitting part overlapping the first light-emitting part and not overlapping the second light-emitting part; and a fourth light-emitting part not overlapping both the first light-emitting part and the second light-emitting part.

The intermediate layer is disposed between the first light-emitting layer and the second light-emitting layer in the third direction and is disposed on a portion overlapping the first light-emitting part.

The first hole transport region is disposed on a portion overlapping the first light-emitting part, the second light-emitting part, and the fourth light-emitting part when viewed from above the reference plane to inject/transport a hole from the anode into the first light-emitting part and the second light-emitting part.

The second hole transport region is disposed on a portion overlapping the fourth light-emitting part in the third direction to transport a hole from the first hole transport region into the fourth light-emitting part.

The first electron transport region is disposed on a portion overlapping the first light-emitting part, the second light-emitting part, and the fourth light-emitting part when viewed from above the reference plane to inject/transport an electron from the cathode into the third light-emitting part and the fourth light-emitting part.

The second electron transport region is disposed on a portion overlapping the second light-emitting part in the third direction to transport an electron from the first electron transport region into the second light-emitting part.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
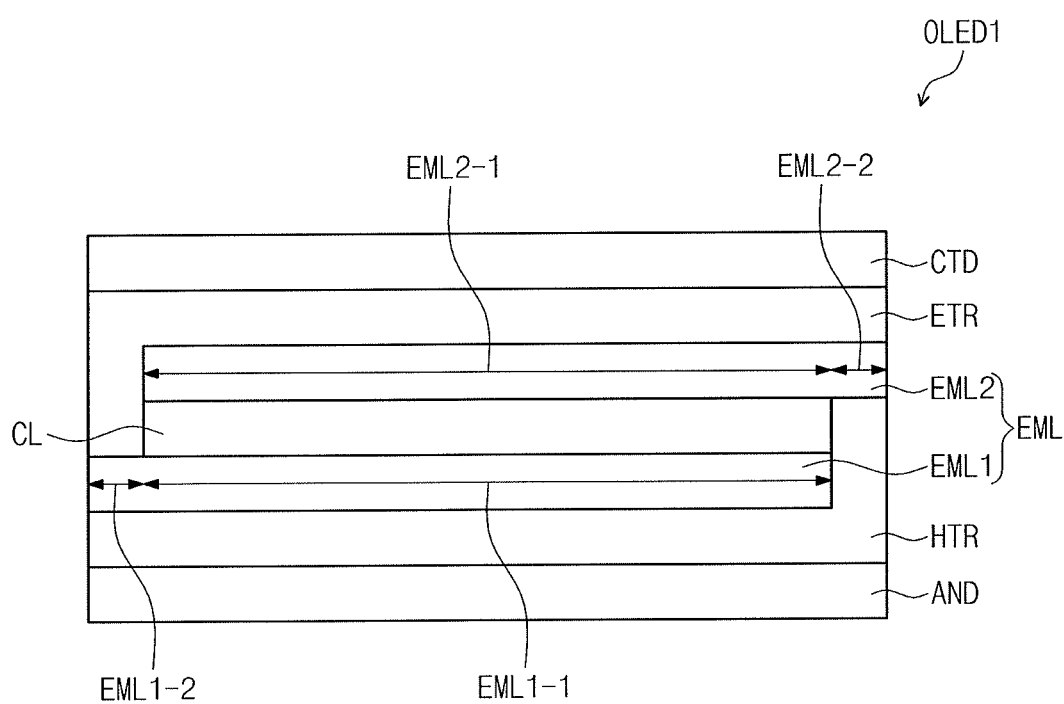
FIGS. 1 to 3 illustrate cross-sectional views of organic light emitting devices according to an embodiment.
Figure 1:
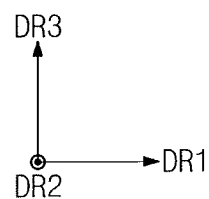

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will also be understood that when a layer or element is referred to as being "on" another layer or substrate, it can be directly on the other layer or substrate, or intervening layers may also be present. Further, it will also be understood that when a layer is referred to as being "between" two layers, it can be the only layer between the two layers, or one or more intervening layers may also be present. In addition, although a surface of a layer may be illustrated as being flat in the drawings, it is not required that the surface be necessarily flat, and a step difference on a surface of an upper layer may be generated by a surface shape of a lower layer.

Hereinafter, an organic light emitting device and an organic light emitting display including the same according to an embodiment will be described below with reference to the accompanying drawings.

Figure 2:
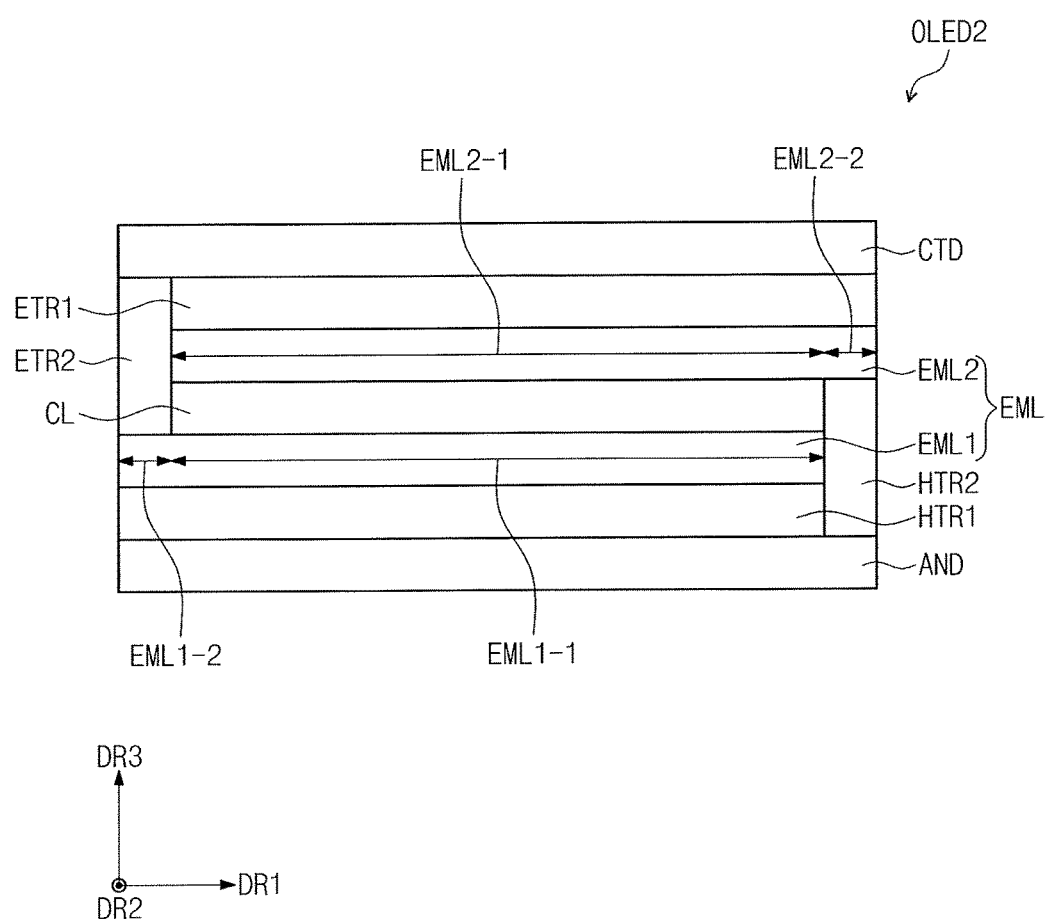
Figure 3:
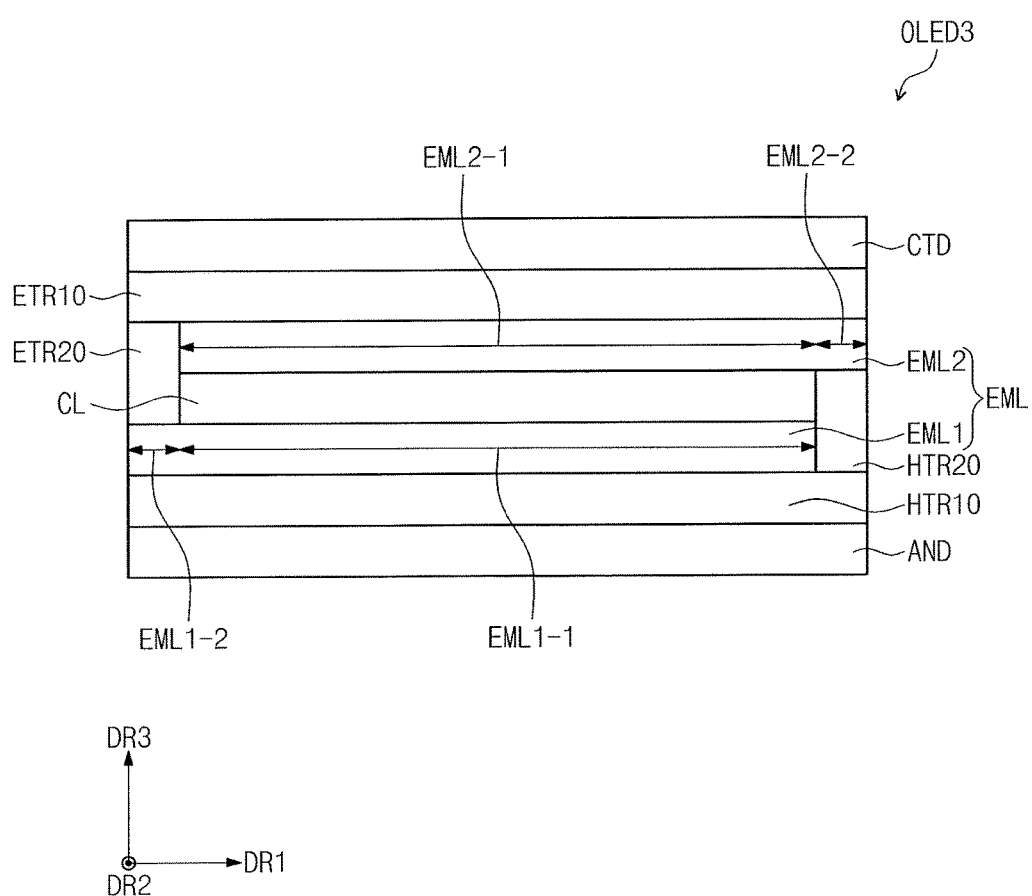

FIGS. 1 to 3 are cross-sectional views of organic light emitting devices according to an embodiment.

For example, as illustrated in FIG. 1, an organic light emitting device OLED1, i.e., an organic light emitting diode OLED1, according to an embodiment may include an anode AND, a cathode CTD, a light-emitting layer EML, an intermediate layer CL, a hole transport region HTR, and an electron transport region ETR. The light-emitting layer EML includes a first light-emitting layer EML1 and a second light-emitting layer EML2.

The anode AND is disposed on a reference plane defined by a first direction DR1 and a second direction DR2 that are perpendicular to each other. The anode AND may be a pixel electrode or a positive electrode. The anode AND may be a transmissive electrode, a semi-transmissive electrode, or a reflective electrode.

When the anode AND is a transmissive electrode, the anode AND may be formed of a transparent metal oxide, e.g., indium tin oxide (ITO), indium zinc oxide (IZO), zinc oxide (ZO), or indium tin zinc oxide (ITZO). When the anode AND is a semi-transmissive electrode or a reflective electrode, the anode AND may include, e.g., Ag, Mg, Al, Pt, Pd, Au, Ni, Nd, Ir, Cr or a mixture thereof.

The anode AND may have a single-layer structure having a single layer including a transparent metal oxide or a metal or a multi-layer structure having a plurality of layers including a transparent metal oxide or a metal. For example, the anode AND may have a single-layer structure of ITO, Ag, or a metal mixture (e.g., a mixture of Ag and Mg), a two-layer structure of ITO/Mg or ITO/MgF, or a three-layer structure of ITO/Ag/ITO, but not limited thereto.

The cathode CTD is spaced apart from the anode AND in a third direction DR3 that is a normal direction relative to the reference plane. The cathode CTD may be a common electrode or a negative electrode. The cathode CTD may be a transmissive electrode, a semi-transmissive electrode, or a reflective electrode.

When the cathode CTD is a transmissive electrode, the cathode CTD may include, e.g., Li, Ca, LiF/Ca, LiF/Al, Al, Mg, BaF, Ba, Ag, or a compound thereof, or a mixture thereof (e.g., a mixture of Ag and Mg). The cathode CTD may include an auxiliary electrode. The auxiliary electrode may include a film formed by depositing the foregoing material so as to face the light-emitting layer, a transparent metal oxide, e.g., indium tin oxide (ITO), IZO (indium zinc oxide), ZnO (zinc oxide), ITZO (indium tin zinc oxide) on the film, and Mo, and Ti. When the cathode CTD is a semi-transmissive electrode or a reflective electrode, the cathode CTD may include, e.g., Ag, Mg, Al, Pt, Pd, Au, Ni, Nd, Ir, Cr, Li, Ca, LiF/Ca, LiF/Al, Mo, Ti or a compound thereof, or a mixture thereof (e.g., a mixture of Ag and Mg). Or, the cathode CTD may have a multiple layer structure including a reflective film or a semi-transmissive film including the material, and a transparent conductive film formed of indium tin oxide (ITO), indium zinc oxide (IZO), zinc oxide (ZnO), indium tin zinc oxide (ITZO) or the like.

When the organic light emitting device is a top emission type organic light emitting device, the anode AND may be a reflective electrode, and the cathode CTD may be a transmissive electrode or a semi-transmissive electrode. When the organic light emitting device is a bottom emission type organic light emitting device, the anode AND may be a transmissive electrode or a semi-transmissive electrode, and the cathode CTD may be a reflective electrode.

The light-emitting layer EML includes the first light-emitting layer EML1 and the second light-emitting layer EML2.

The first light-emitting layer EML1 is disposed between the anode AND and the cathode CTD, and includes a first light-emitting part EML1-1 and a second light-emitting part EML1-2. The second light-emitting layer EML2 is disposed spaced apart from the first light-emitting layer EML1 in the third direction DR3, e.g., the second light-emitting layer EML2 is disposed between the first light-emitting layer EML1 and the cathode CTD.

The second light-emitting layer EML2 includes a third light-emitting part EML2-1 overlapping the first light-emitting part EML1-1 and not overlapping the second light-emitting part EML1-2. In addition, the second light-emitting layer EML2 includes a fourth light-emitting part EML2-2 not overlapping either of the first light-emitting part EML1-1 and the second light-emitting part EML1-2. In other words, as illustrated in FIG. 1, the first and second light-emitting layers EML1 and EML2 may be offset horizontally, so only the first and third light-emitting parts EML1-1 and EML2-1 overlap, i.e., each of the second and fourth light-emitting layer parts EML1-2 and EML2-2 extends outside an overlap region of the first and second light-emitting layers EML1 and EML2.

The width of the first light-emitting part EML1-1 along the first direction DR1 is about 7 times to about 9 times the width of the second light-emitting part EML1-2 along the first direction DR1. When the width of the first light-emitting part EML1-1 is less than about 7 times the width of the second light-emitting part EML1-2, the width of the first light-emitting part EML1-1 becomes relatively small, thereby reducing light emission efficiency. When the width of the first light-emitting part EML1-1 is more than about 9 times the width of the second light-emitting part EML1-2, the width of the second light-emitting part EML1-2 becomes relatively small, and therefore, a smooth injection of electrons into the first light-emitting layer EML1 may not occur. In addition, the width of the third light-emitting part EML2-1 along the first direction DR1 is about 7 times to about 9 times the width of the fourth light-emitting part EML2-2 along the first direction DR1, for the same reasons discussed previously with respect to the width ratio of the first light-emitting part EML1-1 and the second light-emitting part EML1-2.

The light-emitting layer EML may be formed by using any convenient method, e.g., vacuum deposition, spin coating, casting, Langmuir-Blodgett method, an inkjet printing method, a laser printing method, and a laser induced thermal imaging (LITI). The light-emitting layer EML may be formed of, but not particularly limited to, any suitable material emitting, e.g., red, green, or blue light, and may include, e.g., a fluorescent material or a phosphorescent material. Further, the light-emitting layer EML may include a host material and a dopant material.

The host material may be, but not particularly limited to, e.g., tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4', 4"-Tris(carbazol-9-yl)-triphenylamine (TCTA), 1,3,5-tris (N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN) or the like.

A highest occupied molecular orbital (HOMO) energy level of the host may range from about 5.5 eV to about 5.9 eV. A lowest unoccupied molecular orbital (LUMO) energy level of the host may range from about 2.5 eV to about 2.8 eV.

When the light-emitting layer EML emits red light, the light-emitting layer EML may include, e.g., a fluorescent material including PBD:Eu(DBM)3(Phen)(tris(dibenzoyl-methanato)phenanthoroline europium) or perylene. When the light-emitting layer EML emits red light, the dopant included in the light-emitting layer EML may be selected from a metal complex or an organometallic complex such as bis(1-phenylisoquinoline)acetylacetonate iridium (PIQIr(a-cac)), bis(1-phenylquinoline)acetylacetonate iridium (PQIr (acac)), tris(1-phenylquinoline)iridium (PQIr), and octaethylporphyrin platinum (PtOEP).

When the light-emitting layer EML emits green light, the light-emitting layer EML may include, e.g., a fluorescent material including tris(8-hydroxyquinolino)aluminum (Alq3). When the light-emitting layer EML emits green light, the dopant included in the light-emitting layer EML may be selected from a metal complex or an organometallic complex such as fac-tris(2-phenylpyridine)iridium (Ir(ppy) 3).

When the light-emitting layer EML emits blue light, the light-emitting layer EML may include, e.g., a fluorescent material including any one selected from a group consisting of spiro-DPVBi, spiro-6P, distyryl-benzene (DSB), distyryl-arylene (DSA), polyfluorene (PFO) polymers, and poly(p-phenylene vinylene (PPV) polymers. When the light-emitting layer EML emits blue light, the dopant included in the light-emitting layer EML may be selected from a metal complex such as (4,6-F2ppy)2Irpic or an organometallic complex.

The intermediate layer CL is disposed between the first light-emitting layer EML1 and the second light-emitting layer EML2 in the third direction DR3. The intermediate layer CL is disposed adjacent to, e.g., between, the first light-emitting part EML1-1 and the third light-emitting part EML2-1. The intermediate layer CL may pass therethrough light generated from the first light-emitting layer EML1 or the second light-emitting layer EML2.

The intermediate layer CL may prevent a hole or an electron from moving through the first light-emitting layer EML1 and the second light-emitting layer EML2. In detail, the intermediate layer CL prevents movement of a hole or an electron between the first light-emitting part EML1-1 and the third light-emitting part EML2-1. That is, the intermediate layer CL includes an insulating material which may electrically isolate the first light-emitting layer EML1 from the second light-emitting layer EML2.

A highest occupied molecular orbital (HOMO) energy level of the insulating material may be 1.5 times or more the highest occupied molecular orbital (HOMO) energy level of the host included in the light-emitting layer EML. A lowest unoccupied molecular orbital (LUMO) energy level of the insulating material may be 0.7 times or less the lowest unoccupied molecular orbital (LUMO) energy level of the host included in the light-emitting layer EML. Accordingly, the highest occupied molecular orbital (HOMO) energy level of the insulating material may be about 8.25 eV or more. In addition, the lowest unoccupied molecular orbital (LUMO) energy level of the insulating material may be about 1.75 eV or less. When a highest occupied molecular orbital (HOMO) energy level and a lowest unoccupied molecular orbital (LUMO) energy level of the insulating material included in the intermediate layer CL satisfy the above numerical range, the intermediate layer CL may effectively block movement of a hole or an electron.

The hole transport region HTR injects/transports a hole from the anode AND into the first light-emitting part EML1-1, the second light-emitting part EML1-2, and the fourth light-emitting part EML2-2. The hole transport region HTR is in contact with an entire lower surface of the first light-emitting layer EML1. Accordingly, the hole transport region HTR may inject/transport holes necessary for light emission of the first light-emitting layer EML1. The hole transport region HTR is not in contact with the third light-emitting part EML2-1 of the second light-emitting layer EML2, but is in contact with the fourth light-emitting part EML2-2. Accordingly, the hole transport region HTR may inject/transport holes necessary for light emission of the entire second light-emitting layer EML2 through the fourth light-emitting part EML2-2. For example, as illustrated in FIG. 1, the hole transport region HTR may be L-shaped, with a first portion extending horizontally between the anode AND and the first light-emitting part EML1-1, and a second portion extending vertically along lateral sides of the first light-emitting part EML1-1 and the intermediate layer CL to contact the fourth light-emitting part EML2-2.

The hole transport region HTR may include at least one of a hole injection layer, a hole transport layer, a buffer layer, and an electron blocking layer. The hole transport region HTR may have a multi-layer structure having a single layer including a single material, a single layer including a plurality of materials different form each other, or a plurality of layers including a plurality of materials different form each other. For example, the hole transport region HTR may have, but is not limited to, a single-layer structure including a plurality of materials different form each other, or a multi-layer structure of a hole injection layer/hole transport layer, a hole injection layer/hole transport layer/buffer layer, a hole injection layer/buffer layer, a hole transport layer/buffer layer or a hole injection layer/hole transport layer/electron blocking layer, laminated sequentially from the anode AND.

The hole transport region HTR may be formed by using any suitable method, e.g., vacuum deposition, spin coating, casting, Langmuir-Blodgett method, an inkjet printing method, a laser printing method, and a laser induced thermal imaging (LITI).

When the hole transport region HTR includes a hole injection layer, the hole transport region HTR may include, but is not limited to, a phthalocyanine compound, e.g., copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-Tris(N,N-diphenylamino)triphenylamine (TDATA), 4,4',4"-tris {N,-(2-naphthyl)-N-phenylamino}-triphenylamine (2TNATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), (Polyaniline)/Poly(4-styrenesulfonate) (PANI/PSS) and the like. A thickness of the hole injection layer may range from about 100 Å to about 10000 Å. When the thickness of the hole injection layer satisfies the above mentioned range, a satisfactory hole injection property may be obtained without a substantial rise in a driving voltage.

When the hole transport region HTR includes the hole transport layer, the hole transport region HTR may include a carbazole derivative, e.g., N-phenyl carbazole, polyvinyl carbazole, or the like; a fluorine derivative; a triphenylamine derivative, e.g., N,N'-bis(3-methylphenyl)-N,N'-diphenyl-[1,1-biphenyl]-4,4'-diamine (TPD), 4,4',4"-tris(N-carbazolyl)triphenylamine (TCTA), or the like; N,N-di(1-naphthyl)-N,N-diphenylbenzidine (NPB), 4,4'-Cyclohexylidene bis[N,N-bis(4-methylphenyl)benzenamine] (TAPC), and the like. A thickness of the hole transport layer may range from about 50 Å to about 2000 Å. When the thickness of the hole transport layer satisfies the above mentioned range, a satisfactory hole transport property may be obtained without a substantial rise in the driving voltage.

The hole transport region HTR may further include, in addition to above-mentioned material, a charge generating material to improve the conductivity thereof. The charge generating material may be uniformly or non-uniformly dispersed in the hole transport region HTR. The charge generating material may be, e.g., a p-dopant material. The p-dopant material may be, but is not limited to, one of a quinine derivative, a metal oxide, and a cyano group-containing compound. For example, a non-limiting example of the p-dopant material may include, but is not limited to, a quinone derivative, e.g., tetracyanoquinodimethane (TCNQ) or 2,3,5,6-tetrafluoro-tetracyanoquinodimethane (F4-TCNQ), a metal oxide such as tungsten oxide or molybdenum oxide.

As previously mentioned, the hole transport region HTR may further include, in addition to the hole injection layer and the hole transport layer, at least one of a buffer layer and an electron blocking layer. The buffer layer may enhance light emission efficiency by compensating for a resonance distance according to a wavelength of light emitted from the light-emitting layer. A material included in the buffer layer may be one of the materials that may be included in the hole transport region HTR. The electron blocking layer is a layer to prevent electrons from being injected into the hole transport region HTR from the electron transport region.

The electron transport region ETR injects/transports electrons from the cathode CTD into the second light-emitting part EML1-2, the third light-emitting part EML2-1, and the fourth light-emitting part EML2-2. The electron transport region ETR is in contact with an entire upper surface of the second light-emitting layer EML2. Accordingly, the electron transport region ETR may inject/transport electrons necessary for light emission of the second light-emitting layer EML2. The electron transport region ETR is not to be in contact with the first light-emitting part EML1-1 of the first light-emitting layer EML1, but is in contact with the second light-emitting part EML1-2. Accordingly, the electron transport region ETR may inject/transport electrons necessary for light emission of the entire first light-emitting layer EML1 through the second light-emitting part EML1-2.

The electron transport region ETR may include, but is not limited to, at least one of a hole blocking layer, an electron transport layer, and an electron injection layer. For example, the electron transport region ETR may have, but is not limited to, a structure of an electron transport layer/electron injection layer or a hole blocking layer/electron transport layer/electron injection layer laminated sequentially from the light-emitting layer EML, or a single-layer structure in which two or more layers of the above layers are mixed.

The electron transport region ETR may be formed by using any suitable method, e.g., vacuum deposition, spin coating, casting, a Langmuir-Blodgett method, an inkjet printing method, a laser printing method, and a laser induced thermal imaging (LITI).

When the electron transport region ETR includes the electron transport layer, the electron transport region ETR may include, but is not limited to, e.g., Tris(8-hydroxyquinolinato)aluminum (Alq3), 1,3,5-Tri(1-phenyl-1H-benzo[d] imidazol-2-yl)phenyl (TPBi), 2,9-Dimethyl-4,7-diphenyl-1, 10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2- methyl-8-quinolinolato-N1,O8)-(1,1'-Biphenyl-4-olato)aluminum (BAlq), berylliumbis(benzoquinolin-10-olate) (Bebq2), 9,10-di(naphthalene-2-yl)anthracene (ADN) and a mixture thereof. A thickness of the electron transport layer may range from about 100 Å to about 1000 Å. When the thickness of the electron transport layer satisfies the above mentioned range, a satisfactory electron transport property may be obtained without a substantial rise in the driving voltage.

When the electron transport region ETR includes the electron injection layer, the electron transport region ETR may include, e.g., LiF, LiQ (Lithium quinolate), $Li_2O$, BaO, NaCl, CsF, a lanthanide metal, e.g., Yb, or a metal halide, e.g., RbCl, RbI, but is not limited thereto. The electron injection layer may also include a material in which an electron transport material and an insulating organo metal salt are mixed. The organo metal salt may be a material having an energy band gap of about 4 eV or higher, e.g., metal acetate, metal benzoate, metal acetoacetate, metal acetylacetonates, or a metal stearate. The thickness of the electron injection layer may range from about 1 Å to about 100 Å. When the thickness of the electron transport layer satisfies the above mentioned range, a satisfactory electron injection property may be obtained without a substantial rise in the driving voltage.

The electron transport region ETR may include, as mentioned above, the hole blocking layer. The hole blocking layer may include, but is not limited to, e.g., at least one of 2,9-dimethyl-4,7-diphenyl-1,10-phenanthroline (BCP) and 4,7-diphenyl-1,10-phenanthroline (Bphen). The thickness of the hole blocking layer may range from about 20 Å to about 1000 Å, e.g., from about 30 Å to about 300 Å. When the thickness of the hole blocking layer satisfies the above mentioned range, an excellent hole-blocking property may be obtained without a substantial rise in the driving voltage.

In another example, as illustrated in FIG. 2, an organic light emitting device OLED2 according to another embodiment may include the anode AND, the cathode CTD, the light-emitting layer EML, the intermediate layer CL, a first hole transport region HTR1, a second hole transport region HTR2, a first electron transport region ETR1, and a second electron transport region ETR2. The light-emitting layer EML includes the first light-emitting layer EML1 and the second light-emitting layer EML2.

The anode AND is disposed on the reference plane defined by the first direction DR1 and the second direction DR2 that are perpendicular to each other. The structure and properties of the anode AND are as described in FIG. 1. Further, the material included in the anode AND is also as described in FIG. 1.

The cathode CTD may be spaced apart from the anode AND in the third direction DR3 that is a normal direction of the reference plane. The structure and properties of the cathode CTD are as described in FIG. 1. Further, the material included in the cathode CTD is also as described in FIG. 1.

The light-emitting layer EML includes the first light-emitting layer EML1 and the second light-emitting layer EML2. The first light-emitting layer EML1 is disposed between the anode AND and the cathode CTD, and includes the first light-emitting part EML1-1 and the second light-emitting part EML1-2.

The second light-emitting layer EML2 is disposed spaced apart from the first light-emitting layer EML1 in the third direction DR3. The second light-emitting layer EML2 includes the third light-emitting part EML2-1 overlapping the first light-emitting part EML1-1 and not overlapping the second light-emitting part EML1-2. The second light-emitting layer EML2 includes the fourth light-emitting part EML2-2 not overlapping both of the first light-emitting part EML1-1 and the second light-emitting part EML1-2.

The width of the first light-emitting part EML1-1 is preferably about 7 to about 9 times the width of the second light-emitting part EML1-2. When the width of the first light-emitting part EML1-1 is less than about 7 times the width of the second light-emitting part EML1-2, the ratio of the first light-emitting part EML1-1 becomes relatively small, and thus light emission efficiency is reduced. When the width of the first light-emitting part EML1-1 is more than about 9 times the width of the second light-emitting part EML1-2, the ratio of the second light-emitting part EML1-2 becomes relatively small. Therefore, a smooth injection of electrons into the first light-emitting layer EML1 does not occur. In addition, the width of the third light-emitting part EML2-1 is preferably about 7 to about 9 times the width of the fourth light-emitting part EML2-2. The reason is same as why the width of the first light-emitting part EML1-1 is about 7 to about 9 times the width of the second light-emitting part EML1-2.

The structure and properties of the first light-emitting layer EML1 are as described in FIG. 1. Further, the material included in the first light-emitting layer EML1 is also as described in FIG. 1. The structure, forming method, and properties of the second light-emitting layer EML2 are as described in FIG. 1. Further, the material included in the second light-emitting layer EML2 is also as described in FIG. 1. That is, the structure, forming method, and properties of the light-emitting layer EML are as described in FIG. 1. Further, the material included in the light-emitting layer EML is also as described in FIG. 1.

The intermediate layer CL is disposed between the first light-emitting layer EML1 and the second light-emitting layer EML2 in the third direction DR3. The intermediate layer CL is disposed on a portion overlapping the light-emitting part EML1-1. The structure and properties of the intermediate layer CL are as described in FIG. 1. Further, the material included in the intermediate layer CL is also as described in FIG. 1.

The first hole transport region HTR1 is disposed to overlap the first light-emitting part EML1-1 and the second light-emitting part EML1-2 in the third direction DR3. That is, the first hole transport region HTR1 is in contact only with the first light-emitting part EML1-1 and the second light-emitting part EML1-2 among the light-emitting parts EML1-1, EML1-2, EML2-1, and EML2-2. The first hole transport region HTR1 injects/transports holes from the anode AND into the first light-emitting part EML1-1 and the second light-emitting part EML1-2. Accordingly, the first hole transport region HTR1 may inject/transport holes necessary for light emission of the first light-emitting layer EML1.

The second hole transport region HTR2 is disposed on a portion overlapping the fourth light-emitting part EML2-2 in the third direction DR3. The second hole transport region HTR2 is disposed between the fourth light-emitting part EML2-2 and the anode AND in the third direction DR3. The second hole transport region HTR2 is in contact only with the first and fourth light-emitting parts EML2-2 and EML1-1 among the light-emitting parts EML1-1, EML1-2, EML2-1, and EML2-2. The second hole transport region HTR2 is in contact with the anode AND. Further, the second hole transport region HTR2 is in contact only with the fourth light-emitting parts EML2-2 among the light-emitting parts EML1-1, EML1-2, EML2-1, and EML2-2 in the third direction DR3. Accordingly, the second hole transport region HTR2 may inject/transport holes necessary for light emission of the entire second light-emitting layer EML2 through the fourth light-emitting part EML2-2.

Each of the first hole transport region HTR1 and the second hole transport region HTR2 may include at least one of a hole injection layer, a hole transport layer, a buffer layer, and an electron blocking layer. Each of the first hole transport region HTR1 and the second hole transport region HTR2 may have a multi-layer structure having a single-layer including a single material, a single-layer including a plurality of materials different from each other, or a plurality of layers including a plurality of materials different from each other.

For example, each of the first hole transport region HTR1 and the second hole transport region HTR2 may have, but is not limited to, a single-layer structure including a plurality of materials different form each other, or a multi-layer structure of a hole injection layer/hole transport layer, a hole injection layer/hole transport layer/buffer layer, a hole injection layer/buffer layer, a hole transport layer/buffer layer or a hole injection layer/hole transport layer/electron blocking layer, laminated sequentially from the anode AND.

The forming method and property of each of the first hole transport region HTR1 and the second hole transport region HTR2 are the same as those described with reference to the hole transport region HTR in FIG. 1. Further, the material included in each of the first hole transport region HTR1 and the second hole transport region HTR2 is also the same as that included in the hole transport region HTR described with reference to FIG. 1.

The first electron transport region ETR1 is disposed to overlap the third light-emitting part EML2-1 and the fourth light-emitting part EML2-2 in the third direction DR3. That is, the first electron transport region ETR1 is in contact only with the third light-emitting part EML2-1 and the fourth light-emitting part EML2-2 among the light-emitting parts EML1-1, EML1-2, EML2-1, and EML2-2. The first electron transport region ETR1 injects/transports electrons from the cathode CTD into the third light-emitting part EML2-1 and the fourth light-emitting part EML2-2. Accordingly, the first electron transport region ETR1 may inject/transport electrons necessary for light emission of the second light-emitting layer EML2.

The second electron transport region ETR2 is disposed on a portion overlapping the second light-emitting part EML1-2 in the third direction DR3. The second electron transport region ETR2 is disposed between the second light-emitting part EML1-2 and the cathode CTD in the third direction DR3. The second electron transport region ETR2 is in contact only with the second light-emitting part EML1-2 among the light-emitting parts EML1-1, EML1-2, EML2-1, and EML2-2 in the third direction DR3. The second electron transport region ETR2 is in contact with the cathode CTD. Accordingly, the second electron transport region ETR2 can inject/transport electrons necessary for light emission of the entire first light-emitting layer EML1 through the second light-emitting part EML1-2.

Each of the first electron transport region ETR1 and the second electron transport region ETR2 may include, but is not limited to, at least one of a hole blocking layer, an electron transport layer, and an electron injection layer. For example, the first electron transport region ETR1 and the second electron transport region ETR2 may have, but are not limited to, a laminate structure of an electron transport layer/electron injection layer or a hole blocking layer/electron transport layer/electron injection layer sequentially laminated from the light-emitting layer EML, or a single-layer structure in which two or more of the above layers are mixed, but not limited thereto.

The forming method and property of each of the first electron transport region ETR1 and the second electron transport region ETR2 are the same as the forming method and the property of the electron transport region ETR described in FIG. 1. Further, the material included in each of the first electron transport region ETR1 and the second electron transport region ETR2 is also the same as the material included in the electron transport region ETR described in FIG. 1.

In yet another example, as illustrated in FIG. 3, an organic light emitting device OLED3 according to yet another embodiment may include the anode AND, the cathode CTD, the light-emitting layer EML, the intermediate layer CL, a first hole transport region HTR10, a second hole transport region HTR20, a first electron transport region ETR10, and a second electron transport region ETR20. The light-emitting layer EML includes the first light-emitting layer EML1 and the second light-emitting layer EML2.

The anode AND is disposed on the reference plane defined by the first direction DR1 and the second direction DR2 that are perpendicular to each other. The structure and properties of the anode AND are as described in FIG. 1. Further, the material included in the anode AND is also as described in FIG. 1.

The cathode CTD may be spaced apart from the anode AND in the third direction DR3 that is a normal direction of the reference plane. The structure and properties of the cathode CTD are as described in FIG. 1. Further, the material included in the cathode CTD is also as described in FIG. 1.

The light-emitting layer EML includes the first light-emitting layer EML1 and the second light-emitting layer EML2. The first light-emitting layer EML1 is disposed between the anode AND and the cathode CTD and includes the first light-emitting part EML1-1 and the second light-emitting part EML1-2. The second light-emitting layer EML2 is disposed spaced apart from the first light-emitting layer EML1 in the third direction DR3. The second light-emitting layer EML2 includes the a third light-emitting part EML2-1 overlapping the first light-emitting part EML1-1 and not overlapping second light-emitting part EML1-2. In addition, the second light-emitting layer EML2 includes the fourth light-emitting part EML2-2 not overlapping both of the first light-emitting part EML1-1 and the second light-emitting part EML1-2.

The width of the first light-emitting part EML1-1 is preferably about 7 to about 9 times the width of the second light-emitting part EML1-2. When the width of the first light-emitting part EML1-1 is less than about 7 times the width of the second light-emitting part EML1-2, the ratio of the first light-emitting part EML1-1 becomes relatively small, and thus light emission efficiency is reduced. When the width of the first light-emitting part EML1-1 is more than about 9 times the width of the second light-emitting part EML1-2, the ratio of the second light-emitting part EML1-2 becomes relatively small. Therefore, a smooth injection of electrons into the first light-emitting layer EML1 does not occur. In addition, the width of the third light-emitting part EML2-1 is preferably about 7 to about 9 times the width of the fourth light-emitting part EML2-2. The reason is the same as why the width of the first light-emitting part EML1-1 is about 7 to about 9 times the width of the second light-emitting part EML1-2.

The structure, forming method and properties of each of the first light-emitting layer EML1 and the second light-emitting layer EML2 are as described in FIG. 1. Further, the material included in each of the first light-emitting layer EML1 and the second light-emitting layer EML2 is also as described in FIG. 1. That is, the structure, forming method, and property of the light-emitting layer EML are as described in FIG. 1. Further, the material included in the light-emitting layer EML is also as described in FIG. 1.

The intermediate layer CL is disposed between the first light-emitting layer EML1 and the second light-emitting layer EML2 in the third direction DR3. The intermediate layer CL is disposed on a portion overlapping the light-emitting part EML1-1. The structure and properties of the intermediate layer CL are as described in FIG. 1. Further, the material included in the intermediate layer CL is also as described in FIG. 1.

The first hole transport region HTR10 is disposed to overlap the first light-emitting part EML1-1 and the second light-emitting part EML1-2 in the third direction DR3. That is, the first hole transport region HTR10 is in contact only with the first light-emitting part EML1-1 and the second light-emitting part EML1-2 among the light-emitting parts EML1-1, EML1-2, EML2-1, and EML2-2. Also, when viewed from above the reference plane, the first hole transport region HTR10 is disposed to overlap the fourth light-emitting part EML2-2. The first hole transport region HTR10 is disposed so as not to be in contact with the fourth light-emitting part EML2-2. The first hole transport region HTR10 injects/transports holes from the anode AND into the first light-emitting part EML1-1 and the second light-emitting part EML1-2. Accordingly, the first hole transport region HTR10 may inject/transport holes necessary for light emission of the first light-emitting layer EML1.

The second hole transport region HTR20 is disposed on a portion overlapping the fourth light-emitting part EML2-2 in the third direction DR3. The second hole transport region HTR20 is disposed between the fourth light-emitting part EML2-2 and the first hole transport region HTR10 in the third direction DR3. The second hole transport region HTR20 is in contact only with the fourth light-emitting part EML2-2 among the light-emitting parts EML1-1, EML1-2, EML2-1, and EML2-2 in the third direction DR3. The second hole transport region HTR20 is in contact with the first hole transport region HTR10. Accordingly, the second hole transport region HTR20 may transport holes necessary for light emission of the entire second light-emitting layer EML2 through the fourth light-emitting part EML2-2.

The forming method and property of each of the first hole transport region HTR10 and the second hole transport region HTR20 are the same as the forming method and property of the hole transport region HTR described in FIG. 1. Further, the material included in each of the first hole transport region HTR10 and the second hole transport region HTR20 is also the same as the material included in the hole transport region HTR described in FIG. 1.

The first electron transport region ETR10 is disposed to overlap the third light-emitting part EML2-1 and the fourth light-emitting part EML2-2 in the third direction DR3. The first electron transport region ETR10 is in contact only with the third light-emitting part EML2-1 and the fourth light-emitting part EML2-2 among the light-emitting parts EML1-1, EML1-2, EML2-1, and EML2-2. Also, when viewed from above the reference plane, the first electron transport region ETR10 is disposed to overlap the second light-emitting part EML1-2. The first electron transport region ETR10 is disposed so as not to be in contact with the second light-emitting part EML1-2. The first electron transport region ETR10 injects/transports electrons from the cathode CTD into the third light-emitting part EML2-1 and the fourth light-emitting part EML2-2. Accordingly, the first electron transport region ETR10 can inject/transport electrons necessary for light emission of the second light-emitting layer EML2.

The second electron transport region ETR20 is disposed on a portion overlapping the second light-emitting part EML1-2 in the third direction DR3. In the third direction DR3, the second electron transport region ETR20 is disposed between the second light-emitting part EML1-2 and the first electron transport region ETR10. In the third direction DR3, the second electron transport region ETR20 is in contact only with the second light-emitting part EML1-2 among the light-emitting parts EML1-1, EML1-2, EML2-1, and EML2-2. The second electron transport region ETR20 is in contact with the first electron transport region ETR10. Accordingly, the second electron transport region ETR20 can inject/transport electrons necessary for light emission of the entire first light-emitting layer EML1 through the second light-emitting part EML1-2.

The forming method and property of each of the first electron transport region ETR10 and the second electron transport region ETR20 are the same as the forming method and property of the electron transport region ETR described in FIG. 1. Further, the material included in each of the first electron transport region ETR10 and the second electron transport region ETR20 is also same as the material included in the electron transport region ETR described in FIG. 1.

When any of the organic light emitting devices (OLED1 to OLED3) illustrated in FIG. 1 to 3 is used, a total area of a light-emitting interface is widened by two light-emitting layers EML1 and EML2, so that light emission efficiency is improved. In addition, holes and electrons may be effectively injected into each of the light-emitting layers EML1 and EML2 through the hole transport regions HTR, HTR1, and HTR10 and the electron transport regions ETR, ETR1, and ETR10 each having a structural feature. Further, the lifespan of the device may be enhanced by reducing stress applied to the organic light emitting devices OLED1 to OLED3. Therefore, organic light emitting devices (OLED1 to OLED3) having a good afterimage characteristic may be manufactured.

Hereinafter, with reference to the accompanying FIGS. 4 to 8, an organic light emitting display having an organic light emitting device according to an embodiment will be described.

Figure 4:
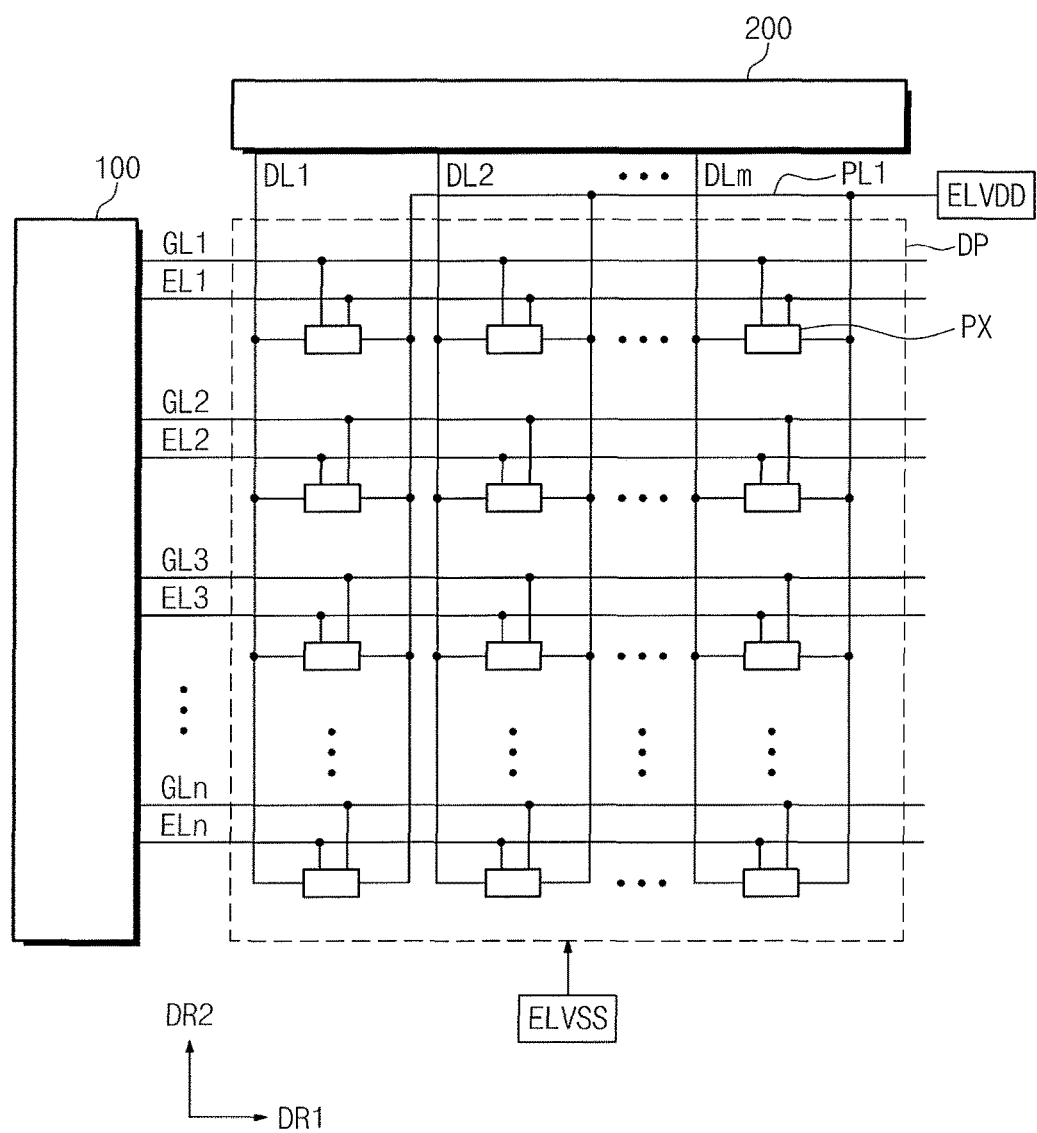
FIG. 4 illustrates a block diagram of a an organic light emitting display according to an embodiment.

FIG. 4 is a block diagram of an organic light emitting display according to an embodiment.

As illustrated in FIG. 4, an organic light emitting display may include a scan driver 100, a data driver 200, and a display panel DP.

The scan driver 100 receives a gate control signal (not shown) from a timing controller (not shown). The gate control signal may include a vertical start signal for starting an operation of the scan driver 100, and a clock signal determining output timings of signals. The scan driver 100 generates a plurality of gate signals, and sequentially outputs the plurality of gate signals to a plurality of gate lines GL1 to GLn which will be described below. Further, the scan driver 100 generates a plurality of light emission control signals in response to the gate control signal, and outputs the plurality of light emission control signals to a plurality of light emitting lines EL1 to ELn which will be described below.

Although FIG. 4 illustrates that the plurality of gate signals and the plurality of light emission control signals are output from the one scan driver 100, embodiments are not limited thereto. In an embodiment, a plurality of scan drivers may divide and output a plurality of gate signals, and may divide and output a plurality of light emission control signals. In addition, in an embodiment, it is also possible to separately provide a drive circuit generating and outputting the plurality of gate signals and a driver circuit generating and outputting the plurality of light emission control signals.

The data driver 200 receives a data control signal (not shown) and image data (not shown) from the timing controller. The data driver 200 converts the image data into data signals, and outputs the data signals to a plurality of data lines (DL1 to DLm) insulated and crossing the gate lines (GL1 to GLn). The data signals are analog voltages corresponding to grayscale values of the image data.

The display panel DP includes the plurality of gate lines GL1 to GLn, the plurality of light emitting lines EL1 to ELn, the plurality of data lines DL1 to DLm, and a plurality of pixels PX. The plurality of gate lines GL1 to GLn are extended in the first direction DR1, and are arranged in the second direction DR2 that is perpendicular to the DR1. The plurality of light emitting lines EL1 to ELn may be respectively arranged in parallel to the corresponding gate lines GL1 to GLn. The plurality of data lines DL1 to DLm are insulated from and crossing the plurality of gate lines GL1 to GLn.

The plurality of pixels PXs in one row are respectively connected to a corresponding one of the plurality of gate lines GL1 to GLn, a corresponding one of the plurality of light emitting lines EL1 to ELn, and the plurality of corresponding data lines DL1 to DLm. Although briefly illustrated in FIG. 4, the plurality of pixels PXs may be respectively connected to the plurality of corresponding gate lines GL1 to GLn.

Figure 5:
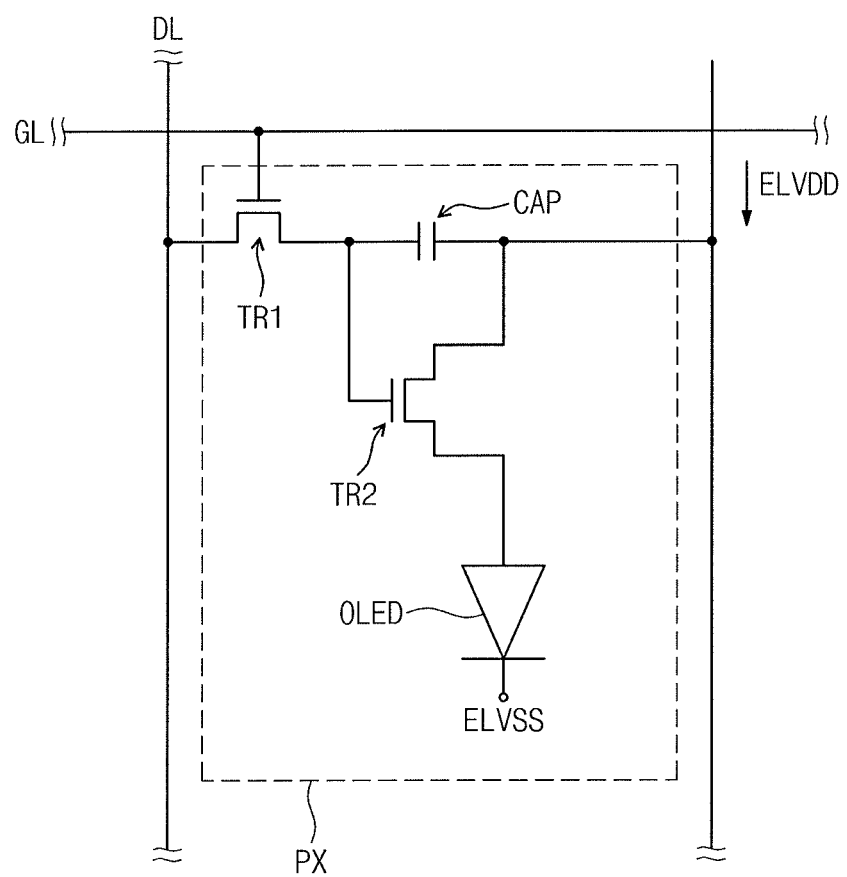
FIG. 5 illustrates an equivalent circuit diagram of a pixel in an organic light emitting display according to an embodiment.

FIG. 5 is an equivalent circuit diagram of a pixel of an organic light emitting display panel according to an embodiment.

As illustrated in FIG. 5, each of the pixels PXs includes an organic light emitting device OLED and a circuit unit controlling the organic light emitting device OLED. The circuit unit includes a first transistor TR1, a second transistor TR2, and a capacitor CAP. Meanwhile, the equivalent circuit of a pixel PX is not limited to FIG. 5, but may be modified and practiced.

The first transistor TR1 includes a control electrode connected to a gate line GL, an input electrode connected to a data line DL, and an output electrode. The first transistor TR1 outputs a data signal applied to the data line DL in response to a gate signal applied to the gate line GL.

The capacitor CAP includes a first electrode connected to the first transistor TR1 and a second electrode receiving a first power supply voltage ELVDD. The capacitor CAP charges a voltage corresponding to the data signal received from the first transistor TR1.

The second transistor TR2 includes a control electrode connected to the output electrode of the first transistor TR1 and to the first electrode of the capacitor CAP, an input electrode receiving the first power supply voltage ELVDD, and an output electrode. The output electrode of the second transistor TR2 is connected to the organic light emitting device OLED. The second transistor TR2 controls a driving current flowing in the organic light emitting device OLED to correspond to the voltage stored in the capacitor CAP.

The organic light emitting device OLED includes the anode AND (see FIG. 1) connected to the second transistor TR2 to receive the first power supply voltage ELVDD, and the cathode CTD (see FIG. 1) receiving a second power supply voltage ELVDD. In addition, the organic light emitting device OLED includes the light-emitting layers EML1 and EML2 (see FIG. 1) disposed between the anode AND (see FIG. 1) and the cathode CTD (see FIG. 1). The organic light emitting device OLED emits light during a turn-on period of the second transistor TR2.

Figure 6:
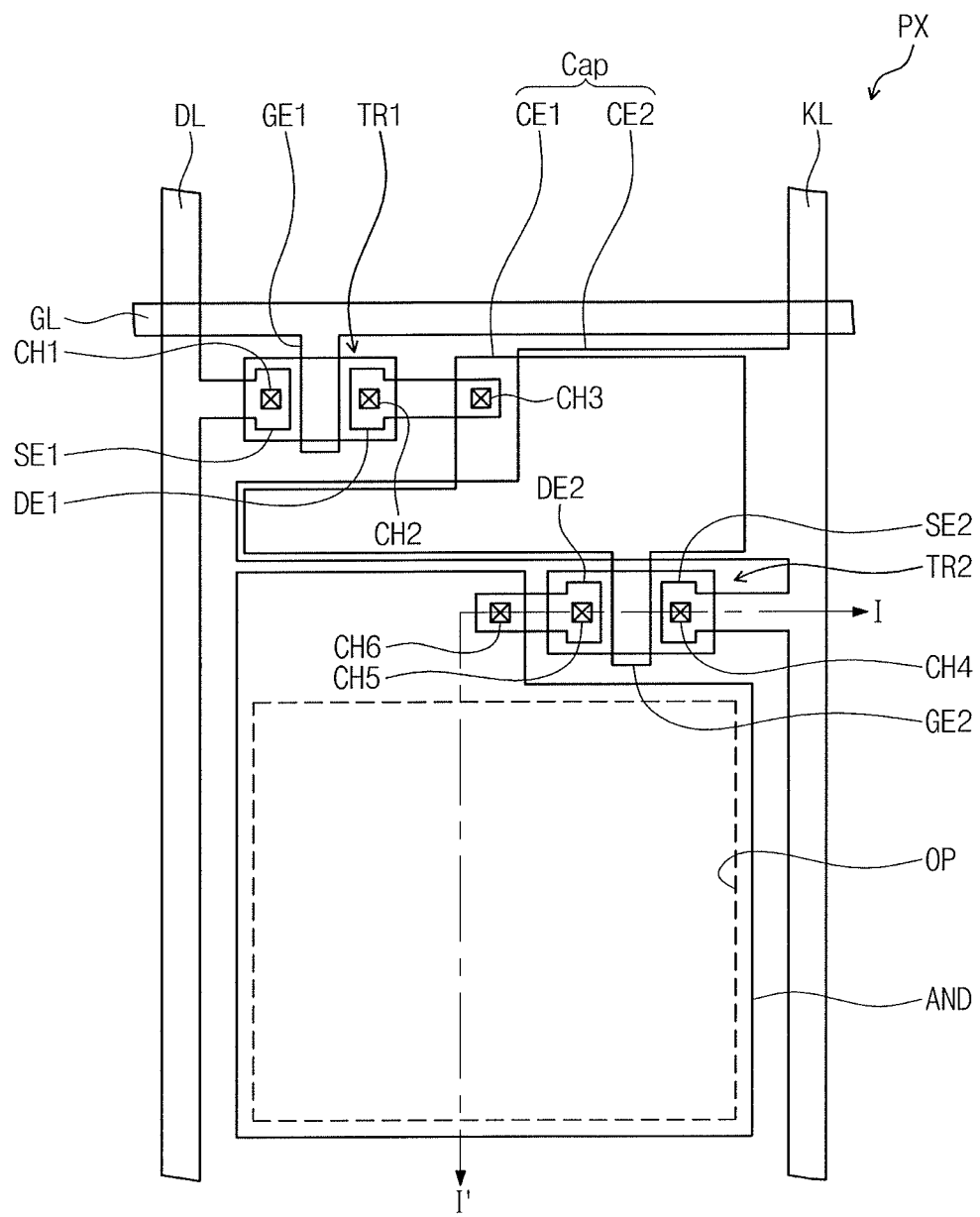
FIG. 6 illustrates a layout of pixels according to an embodiment in an organic light emitting display.
Figure 7:
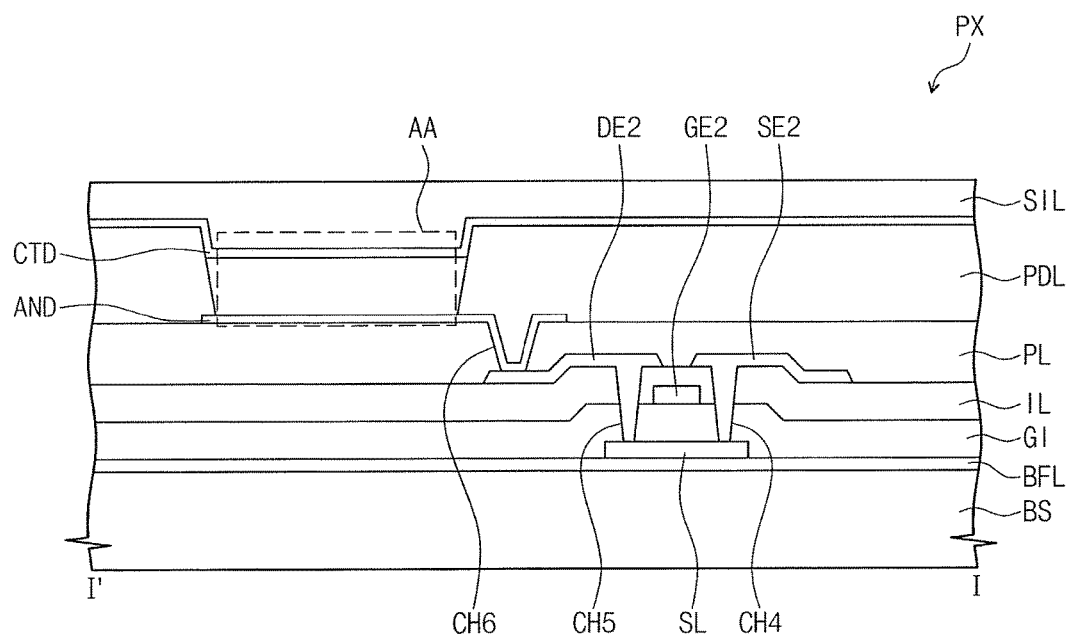
FIG. 7 illustrates a cross-sectional view along line I-I' of FIG. 6.

FIG. 6 is a layout of a pixel according to an embodiment. FIG. 7 is a cross-sectional view taken along line I-I' of FIG. 6. Hereinafter, with reference to the accompanying FIGS. 6 and 7, an organic light emitting display panel will be described in more detail.

Referring to FIGS. 6-7, the organic light emitting display panel DP includes a base substrate BS, a buffer layer BFL, signal lines GL and DL, and pixels PX. Depending on a type of the organic light emitting display panel DP, configurations of the base substrate BS, the buffer layer BFL, the signal lines GL and DL, and the pixels PX may be changed.

The buffer layer BFL may be disposed on one surface of the base substrate BS. The buffer layer BFL, during a manufacturing process, prevents an impurity present in the base substrate BS from being introduced into the pixels PX. In particular, the impurity is prevented from being diffused in a semiconductor layer SL of the pixels PX. The impurity may be introduced from outside, or may be generated by thermal decomposition of the base substrate BS. The impurity may be sodium or a gas discharged from the base substrate BS. In addition, the buffer layer BFL blocks moisture introduced into pixels PX from outside.

The signal lines GL and DL and the pixels PX are disposed on the buffer layer BFL. A semiconductor layer SL of the second transistor TR2 is disposed on the buffer layer BFL. The semiconductor layer SL may include polysilicon or amorphous silicon formed at a low temperature. In addition, the semiconductor layer SL may include a metal oxide semiconductor.

The semiconductor layer SL includes a channel region acting as a passage through which electrons or holes move, and a first ion-doped region and a second ion-doped region disposed with the channel region in-between.

A gate insulating layer GI covering the semiconductor layer SL is disposed on the buffer layer BFL. The gate insulating layer GI includes an organic film and/or an inorganic film. In particular, the gate insulating layer GI may include a plurality of inorganic thin films. The plurality of inorganic thin films may include a silicon nitride layer and a silicon oxide layer.

Gate line GL is disposed on the gate insulating layer GI. A control electrode (GE1: hereinafter, a first control electrode) of a first transistor TR1 and a control electrode (GE2: hereinafter, a second control electrode) of the second transistor TR2 are disposed on the gate insulating layer GI.

A first electrode CE1 of a capacitor CAP may be disposed on the gate insulating layer GI. However, a disposed position of the first electrode CE1 is not limited thereto. The first electrode CE1 may be manufactured together with the gate line GL according to the same photolithography process. In other words, the first electrode CE1 may be formed of the same material as the gate line.

An interlayer insulating layer IL covering the first control electrode GE1, the second control electrode GE2, and the first electrode CE1 is disposed on the gate insulating layer GI. The interlayer insulating layer IL includes an organic film and/or inorganic film. In particular, the interlayer insulating layer IL may include a plurality of inorganic thin films. The plurality of inorganic thin films may include a silicon nitride layer and a silicon oxide layer.

Data line DL and power line KL are disposed on the interlayer insulation layer IL. An input electrode (SE1: hereinafter, a first input electrode) of the first transistor TR1 and an output electrode (DE1: hereinafter, a second output electrode) of the first transistor TR1 are disposed on the interlayer insulating layer IL. An input electrode (SE2: hereinafter, a second input electrode) of the second transistor TR2 and an output electrode (DE2: hereinafter, a second output electrode) of the second transistor TR2 are disposed on the interlayer insulating layer IL. The first input electrode SE1 is branched from the data line DL. The second input electrode SE2 is branched from the power line KL.

A second electrode CE2 of the capacitor CAP may be disposed on the interlayer insulating layer IL. However, a disposed position of the second electrode CE2 is not limited thereto. The second electrode CE2, the data line DL, and the power line KL may be manufactured according to the same photolithography process, and formed of the same material.

The first input electrode SE1 and the first output electrode DE1 are respectively connected to the semiconductor layer (not shown) of the first transistor TR1 through a first through hole CH1 and a second through hole CH2 penetrating the interlayer insulating layer IL and the center insulating layer IL. The first output electrode DE1 is connected to the first electrode CE1 through a third through hole CH3 penetrating the interlayer insulating layer IL. The second input electrode SE2 and the second output electrode DE2 are respectively connected to the semiconductor layer of the second transistor TR2 through a fourth through hole CH4 and a fifth through hole CH5 penetrating the gate insulating layer GI and the interlayer insulating layer IL. Meanwhile, in another embodiment, the first transistor TR1 and the second transistor TR2 may be modified into a bottom-gate structure and practiced.

A passivation layer PL covering the first input electrode SE1, the first output electrode DE1, the second input electrode SE2, and the second output electrode DE2 is disposed on the interlayer insulating layer IL. The passivation layer PL includes an organic film and/or inorganic film. In particular, the passivation layer PL may include an organic material to provide a flat surface.

A pixel defining layer PDL and an organic light emitting device OLED are disposed on the passivation layer PL. The organic light emitting device OLED includes the anode AND, the hole transport region HTR, the light-emitting layer EML, the electron transport region ETR, and the cathode CTD. The anode AND is connected to the second output electrode DE2 through a sixth through hole CH6 penetrating the passivation layer PL. Positions of the anode AND and the cathode CTD of the organic light emitting device OLED may be interchanged.

The anode AND is disposed on the passivation layer PL. An opening OP of the pixel defining layer PDL exposes the anode AND.

An encapsulation layer SIL is disposed on the cathode CTD. The encapsulation layer SIL may include a plurality of thin-film encapsulation layers. The thin-film encapsulation layers may include a silicon nitride layer and a silicon oxide layer.

Figure 8:
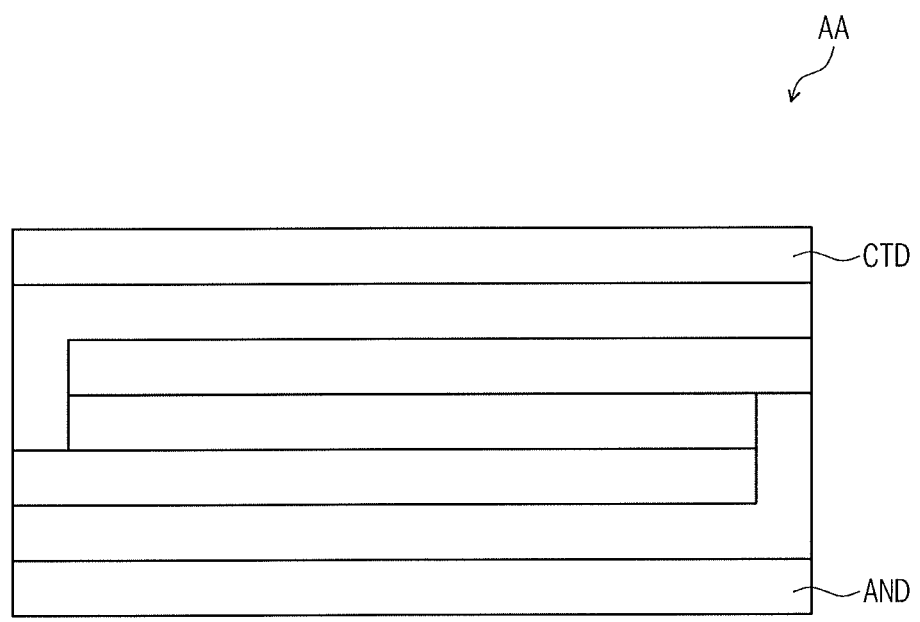
FIG. 8 illustrates an enlarged cross-sectional view of portion AA of FIG. 7.
Figure 8:
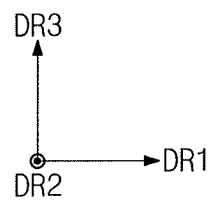

FIG. 8 is an enlarged sectional view of portion AA of FIG. 7. The organic light emitting device OLED illustrated in FIG. 8 is the same as the organic light emitting device OLED1 illustrated in FIG. 1. However, the portion AA of FIG. 7 is not limited to the organic light emitting device OLED1 of FIG. 1. The portion AA of FIG. 7 illustrated in FIG. 8 may be the organic light emitting device OLED2 illustrated in FIG. 2 or the organic light emitting device OLED3 illustrated in FIG. 3.

As illustrated in FIG. 8, the organic light emitting display apparatus including at least one of the organic light emitting devices OLED1, OLED2, and OLED3 illustrated in FIGS. 1 to 3 has high light emission efficiency and a long lifespan. In addition, an organic light emitting display apparatus having a good afterimage characteristic may be realized.

According to the present disclosure, light emission efficiency and lifespan of an organic light emitting device are enhanced. As the light emission efficiency and lifespan of the organic light emitting device are enhanced, an organic light emitting display having a good afterimage characteristic can be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light emitting device, comprising:
an anode on a reference plane, the reference plane being defined by a first direction and a second direction perpendicular to each other;
a cathode spaced apart from the anode in a third direction normal to the reference plane;
a first light-emitting layer between the anode and the cathode, the first light-emitting layer including a first light-emitting part and a second light-emitting part;
a second light-emitting layer spaced apart from the first light-emitting layer in the third direction, the second light-emitting layer including a third light-emitting part and a fourth light-emitting part, the third light-emitting part overlapping the first light-emitting part and not overlapping the second light-emitting part, and the fourth light-emitting part not overlapping either of the first light-emitting part and the second light-emitting part;
an intermediate layer between the first light-emitting layer and the second light-emitting layer in the third direction, the intermediate layer overlapping the first light-emitting part;
a hole transport region to inject/transport a hole from the anode into the first light-emitting part, the second light-emitting part, and the fourth light-emitting part; and
an electron transport region to inject/transport an electron from the cathode into the second light-emitting part, the third light-emitting part, and the fourth light-emitting part.
2. The organic light emitting device as claimed in claim 1, wherein, on a cross section taken along the third direction, a width of the first light-emitting part is about 7 times to about 9 times a width of the second light-emitting part, and a width of the third light-emitting part is about 7 times to about 9 times a width of the fourth light-emitting part.

3. The organic light emitting device as claimed in claim 2, wherein:
each of the first light-emitting layer and the second light-emitting layer includes a host, and
a highest occupied molecular orbital (HOMO) energy level of the host ranges from about 5.5 eV to about 5.9 eV, and a lowest unoccupied molecular orbital (LUMO) energy level of the host ranges from about 2.5 eV to about 2.8 eV.

4. The organic light emitting device as claimed in claim 3, wherein;
the intermediate layer includes an insulating material to electrically isolate the first light-emitting layer from the second light-emitting layer, and
a HOMO energy level of the insulating material ranges from about 8.25 eV to about 11.8 eV, and a LUMO energy level of the insulating material ranges from about 0.5 eV to 1.75 eV.

5. The organic light emitting device as claimed in claim 1, wherein:
the hole transport region includes:
a first hole transport region overlapping the first light-emitting part and the second light-emitting part in the third direction, and
a second hole transport region overlapping the fourth light-emitting part in the third direction; and
the electron transport region includes:
a first electron transport region overlapping the third light-emitting part and the fourth light-emitting part in the third direction, and
a second electron transport region overlapping the second light-emitting part in the third direction.

6. The organic light emitting device as claimed in claim 1, wherein:
the hole transport region includes:
a first hole transport region overlapping the first light-emitting part, the second light-emitting part, and the fourth light-emitting part when viewed from above the reference plane, and
a second hole transport region overlapping the fourth light-emitting part in the third direction; and
the electron transport region includes:
a first electron transport region overlapping the second light-emitting part, the third light-emitting part, and the fourth light-emitting part when viewed from above the reference plane, and
a second electron transport region overlapping the second light-emitting part in the third direction.

7. An organic light emitting device, comprising:
an anode on a reference plane, the reference plane being defined by a first direction and a second direction perpendicular to each other;
a cathode spaced apart from the anode in a third direction normal to the reference plane;
a first light-emitting layer between the anode and the cathode, the first light-emitting layer including a first light-emitting part and a second light-emitting part;
a second light-emitting layer spaced apart from the first light-emitting layer in the third direction, the second light-emitting layer including a third light-emitting part and a fourth light-emitting part, the third light-emitting part overlapping the first light-emitting part and not overlapping the second light-emitting part, and the fourth light-emitting part not overlapping either of the first light-emitting part and the second light-emitting part;
an intermediate layer between the first light-emitting layer and the second light-emitting layer in the third direction, the intermediate layer overlapping the first light-emitting part;
a first hole transport region on a portion overlapping the first light-emitting part and the second light-emitting part in the third direction to inject/transport a hole from the anode into the first light-emitting part and the second light-emitting part;
a second hole transport region on a portion overlapping the fourth light-emitting part in the third direction to injecting/transport a hole from the anode into the fourth light-emitting part;
a first electron transport region on a portion overlapping the third light-emitting part and the fourth light-emitting part in the third direction to inject/transport an electron from the cathode into the third light-emitting part and the fourth light-emitting part; and
a second electron transport region on a portion overlapping the second light-emitting part in the third direction to inject/transport an electron from the cathode into the second light-emitting part.

8. The organic light emitting device as claimed in claim 7, wherein, on a cross section taken along the third direction, a width of the first light-emitting part is about 7 times to about 9 times a width of the second light-emitting part, and a width of the third light-emitting part is about 7 times to about 9 times a width of the fourth light-emitting part.

9. The organic light emitting device as claimed in claim 8, wherein:
each of the first light-emitting layer and the second light-emitting layer includes a host, and
a highest occupied molecular orbital (HOMO) energy level of the host ranges from about 5.5 eV to about 5.9 eV, and a lowest unoccupied molecular orbital (LUMO) energy level of the host ranges from about 2.5 eV to about 2.8 eV.

10. The organic light emitting device as claimed in claim 9, wherein;
the intermediate layer includes an insulating material to electrically isolate the first light-emitting layer from the second light-emitting layer, and
a HOMO energy level of the insulating material ranges from about 8.25 eV to about 11.8 eV, and a LUMO energy level of the insulating material ranges from about 0.5 eV to 1.75 eV.

11. An organic light emitting device, comprising:
an anode on a reference plane, the reference plane being defined by a first direction and a second direction perpendicular to each other;
a cathode spaced apart from the anode in a third direction normal to the reference plane;
a first light-emitting layer between the anode and the cathode, the first light-emitting layer including a first light-emitting part and a second light-emitting part;
a second light-emitting layer spaced apart from the first light-emitting layer in the third direction, the second light-emitting layer including a third light-emitting part and a fourth light-emitting part, the third light-emitting part overlapping the first light-emitting part and not overlapping the second light-emitting part, and the fourth light-emitting part not overlapping either of the first light-emitting part and the second light-emitting part;
an intermediate layer between the first light-emitting layer and the second light-emitting layer in the third direction and overlapping the first light-emitting part;

a first hole transport region on a portion overlapping the first light-emitting part, the second light-emitting part, and the fourth light-emitting part when viewed from above the reference plane to inject/transport a hole from the anode into the first light-emitting part and the second light-emitting part;

a second hole transport region on a portion overlapping the fourth light-emitting part in the third direction to transport a hole from the first hole transport region into the fourth light-emitting part;

a first electron transport region on a portion overlapping the second light-emitting part, the third light-emitting part, and the fourth light-emitting part when viewed from above the reference plane to inject/transport an electron from the cathode into the third light-emitting part and the fourth light-emitting part; and a second electron transport region on a portion overlapping the second light-emitting part in the third direction to transport an electron from the first electron transport region into the second light-emitting part.

12. The organic light emitting device as claimed in claim 11, wherein, on a cross section taken along the third direction, a width of the first light-emitting part is about 7 times to about 9 times a width of the second light-emitting part, and a width of the third light-emitting part is about 7 times to about 9 times a width of the fourth light-emitting part.

13. The organic light emitting device as claimed in claim 12, wherein:

each of the first light-emitting layer and the second light-emitting layer includes a host, and a highest occupied molecular orbital (HOMO) energy level of the host ranges from about 5.5 eV to about 5.9 eV, and a lowest unoccupied molecular orbital (LUMO) energy level of the host ranges from about 2.5 eV to about 2.8 eV.

14. The organic light emitting device as claimed in claim 13, wherein;

the intermediate layer includes an insulating material to electrically isolate the first light-emitting layer from the second light-emitting layer, and a HOMO energy level of the insulating material ranges from about 8.25 eV to about 11.8 eV, and a LUMO energy level of the insulating material ranges from about 0.5 eV to 1.75 eV.

* * * * *